United States Patent
Li et al.

(10) Patent No.: US 12,215,437 B2
(45) Date of Patent: Feb. 4, 2025

(54) GRADIENT SINGLE-CRYSTAL POSITIVE ELECTRODE MATERIAL, AND PREPARATION METHOD THEREFOR AND USE THEREOF

(71) Applicant: HENAN KELONG NEW ENERGY CO., LTD, Xinxiang (CN)

(72) Inventors: Jinsuo Li, Xinxiang (CN); Di Cheng, Xinxiang (CN); Yunjun Xu, Xinxiang (CN); Gaofeng Zuo, Xinxiang (CN); Jing Huang, Xinxiang (CN); Xiaojing Li, Xinxiang (CN); Danfeng Chen, Xinxiang (CN); Wanchao Wen, Xinxiang (CN); Yanping Wang, Xinxiang (CN); Zhengzhong Yin, Xinxiang (CN)

(73) Assignee: HENAN KELONG NEW ENERGY CO., LTD, Henan (CN)

( * ) Notice: Subject to any disclaimer, the term of this patent is extended or adjusted under 35 U.S.C. 154(b) by 0 days.

(21) Appl. No.: 18/276,000

(22) PCT Filed: Nov. 11, 2022

(86) PCT No.: PCT/CN2022/131473
§ 371 (c)(1),
(2) Date: Aug. 4, 2023

(87) PCT Pub. No.: WO2023/083319
PCT Pub. Date: May 19, 2023

(65) Prior Publication Data
US 2024/0117520 A1    Apr. 11, 2024

(30) Foreign Application Priority Data
Nov. 12, 2021 (CN) .......................... 202111338747.4

(51) Int. Cl.
*C01G 51/00* (2006.01)
*C30B 1/12* (2006.01)
(Continued)

(52) U.S. Cl.
CPC ................ *C30B 1/12* (2013.01); *C30B 29/22* (2013.01); *H01M 4/525* (2013.01);
(Continued)

(58) Field of Classification Search
CPC ........ H01M 4/362; H01M 4/48; H01M 4/525; C01G 51/42; C01G 51/44
See application file for complete search history.

(56) References Cited

U.S. PATENT DOCUMENTS

| 2014/0205898 | A1 | 7/2014 | Lee et al. | |
| 2021/0119204 | A1* | 4/2021 | Celasun | C01G 53/42 |
| 2021/0367233 | A1* | 11/2021 | Gan | C01G 53/50 |
| 2023/0074353 | A1* | 3/2023 | Du | H01M 10/0525 |

FOREIGN PATENT DOCUMENTS

| CN | 102122712 A | 7/2011 |
| CN | 110867576 A | 3/2020 |

(Continued)

OTHER PUBLICATIONS

Office Action for counterpart JP Application No. 2023-581090 mailed Nov. 14, 2024.

*Primary Examiner* — Hoa (Holly) Le
(74) *Attorney, Agent, or Firm* — The Sun IP Law (57) ABSTRACT

The present disclosure discloses a gradient single-crystal positive electrode material, which has a chemical formula of $LiNi_xCo_yA_{1-x-y}O_2@mLi_aZ_bO_c$, wherein $0<x<1$, $0<y<1$, $0<x+y<1$, $0<m<0.05$, $0.3<a\leq10$, $1\leq b<4$, and $1\leq c<15$, A is at least one of Mn, Zr, Sr, Ba, W, Ti, Al, Mg, Y, and Nb, and Z is at least one of B, Al, Co, W, Ti, Zr, and Si. The atomic ratio of the content of Co on the surface of the single-crystal positive electrode material particle to the content of (Continued)

Ni+Co+A on the surface is greater than 0.4 and less than 0.8, and the atomic ratio of Co at a depth 10% of the radius from the surface of the single crystal positive electrode material particle is not less than 0.3; and the single-crystal positive electrode material particle has a roundness of greater than 0.4, and is free from sharp corners.

16 Claims, 4 Drawing Sheets

(51) Int. Cl.
*C30B 29/22* (2006.01)
*H01M 4/48* (2010.01)
*H01M 4/525* (2010.01)
*H01M 10/0525* (2010.01)
*H01M 4/02* (2006.01)

(52) U.S. Cl.
CPC .......... *H01M 10/0525* (2013.01); *H01M 2004/021* (2013.01); *H01M 2004/028* (2013.01)

(56) References Cited

FOREIGN PATENT DOCUMENTS

| CN | 111615496 A | | 9/2020 | |
|---|---|---|---|---|
| CN | 113782736 A | | 12/2021 | |
| CN | 113782736 B | * | 3/2022 | |
| EP | 3846259 A1 | | 7/2021 | |
| JP | 2004192846 A | | 7/2004 | |
| JP | 2021508410 A | | 3/2021 | |
| WO | 2019120973 A1 | | 6/2019 | |
| WO | WO-2024046508 A1 | * | 3/2024 | ............ C01G 53/50 |

* cited by examiner

GRADIENT SINGLE-CRYSTAL POSITIVE ELECTRODE MATERIAL, AND PREPARATION METHOD THEREFOR AND USE THEREOF

CROSS REFERENCE TO RELATED APPLICATIONS

This application is a national application of PCT/CN2022/131473, filed on Nov. 11, 2022. The contents of PCT/CN2022/131473 are all hereby incorporated by reference.

TECHNICAL FIELD

The disclosure relates to the technical field of lithium ion batteries, in particular to a gradient single-crystal positive electrode material, and preparation method therefor and use thereof.

BACKGROUND

In recent years, ternary lithium battery has gradually become the most mainstream battery in the market with its advantages of high capacity, good cycle stability and moderate cost, and the like. The ternary positive electrode materials can be divided into two categories in terms of morphology, that is, single-crystal and poly-crystal. Comparing the performance of single-crystal and poly-crystal ternary materials, the overall energy density of the single-crystal ternary material system is high, and the performance of which is better in terms of safety performance and cycle performance. Especially for gradient single-crystal material, it has low impedance, stable cycle performance, high capacity retention rate and high thermal stability. However, when the precursor of gradient single-crystal ternary material is prepared by the traditional coprecipitation method, since the primary sintering temperature is usually very high, the elements will rearrange under the condition of high temperature sintering, that is to say, the previous element gradient distribution will tend to uniform distribution, which greatly compromises the advantages of gradient materials. In the conventional preparation method, the gradient single-crystal material will be pulverized by air flow after primary sintering, during which the agglomerated particles will be forced to open, resulting in sharp edges and corners. Such sharp edges and corners will cause serious abrasion to the equipment during the preparation of the battery electrodes, shorten the service life of the equipment accessories, and greatly increase the manufacturing cost of the battery; In addition, such sharp edges and corners will lead to dilithiation or uneven degree of lithiation of materials during the charging and discharging processes of battery, which will cause strong polarization, and even particle breakage during the cycling process, and the battery life will attenuate rapidly. Moreover, the traditional single-crystal ternary materials usually have poor rate performance.

SUMMARY

The purpose of the disclosure is to provide a gradient single-crystal positive electrode material with good roundness, and it has low impedance, stable cycle performance, high capacity retention rate and high thermal stability. In addition, using the positive electrode material provided by the disclosure can reduce the abrasion of the coating equipment and make it easier to process in the process of preparing the positive electrode sheet.

The disclosure provides a gradient single-crystal positive electrode material, which has a chemical formula of $LiNi_xCo_yA_{1-x-y}O_2@mLi_aZ_bO_c$, where $0<x<1$, $0<y<1$, $0<x+y<1$, $0<m<0.05$, $0.3<a\leq10$, $1\leq b<4$, $1\leq c<15$; A is at least one of Mn, Zr, Sr, Ba, W, Ti, Al, Mg, Y, and Nb, and Z is at least one of B, Al, Co, W, Ti, Zr, and Si; on the surface of the gradient single-crystal positive electrode material particles, the atomic ratio of the content of Co to the content of Ni+Co+A is greater than 0.4 and less than 0.8, and at a depth 10% of the radius from the surface of the gradient single-crystal positive electrode material particles, the atomic ratio of Co is not less than 0.3. Where @ means that $mLi_aZ_bO_c$ is coated on the surface of $LiNi_xCo_yA_{1-x-y}O_2$.

Preferably, the roundness of the gradient single-crystal positive electrode material particles is greater than 0.4, and there are no sharp edges and corners.

Preferably, the initial coulombic efficiency of the gradient single-crystal positive electrode material particles is 89.7% to 91.0%, and the rate of which is 87.33% to 91.0%.

The disclosure provides a lithium ion battery comprising a gradient single-crystal positive electrode material as described above.

The disclosure also provides a preparation method of the gradient single-crystal positive electrode material comprising the following steps:

(1) mixing a lithium source with a material comprising Ni, Co, and A according to a ratio of Li to the sum of moles of Ni, Co, and A of 0.9-1.25:1, and subjecting same to the first sintering in an oxygen-enriched atmosphere at a sintering temperature of 800-1000° C. for a sintering time of 8-15 h upon uniformly mixing, then pulverizing the material to $D_{50}$ of 2.5-5 microns after the material is cooled down, so as to obtain a single-crystal positive electrode material;

(2) mixing the single-crystal positive electrode material prepared in step (1) with micropowder containing Co, with the content of Co being 0.1% to 10% by mass of the single-crystal positive electrode material, and subjecting same to the second sintering in an oxygen-enriched atmosphere at a sintering temperature of 700-900° C. for a sintering time of 3-8 h upon uniformly mixing, then pulverizing and sieving the material after it is cooled down to obtain a positive electrode material having $D_{50}$ of 2.5-5 microns;

(3) mixing the positive electrode material prepared in step (2) with a Li source and a Z-containing compound, then subjecting same to the third sintering in an oxygen-enriched atmosphere at a sintering temperature of 300-750° C. for a sintering time of 3-10 h, and sieving the material after it is cooled down.

Preferably, the material containing Ni, Co and A in step (1) is at least one of the precursors of $Ni_xCo_yA_{1-x-y}(OH)_2$, $Ni_xCo_yA_{1-x-y}CO_3$, $Ni_xCo_yA_{1-x-y}C_2O_4$ prepared by coprecipitation method.

Preferably, the material containing Ni, Co and A in step (1) is a mixture of Ni metal element below the micron order, Co metal element below the micron order and A metal element below the micron order at an atomic ratio of x:y:1−x−y. (Ibid.)

Preferably, the Co in the micropowder containing Co of step (2) is at least one of $Co(OH)_2$, $CoSO_4$, $Co(NO_3)_2$, $CoCO_3$, $CoCl_2$, $CoO$, $Co_3O_4$, and Co metal element.

Preferably, in addition to Co, the micropowder containing Co of step (2) comprises at least one of Mn, Al, W, Zr and Ti, and the proportion of which is 0-50% by mass of Co.

Preferably, the particle size of the Z-containing compound in step (3) is nano-sized, and the primary particles is less than 500 nm.

Preferably, in step (3), the molar ratio of Li to Z in the Li source and the Z-containing compound is 0.3-8:1, preferably 0.3-1.5:1, where, $Li_aZ_bO_c$ can be one or more of compounds $Li_3BO_3$, $LiBO_2$, $LiAlO_2$, $LiCoO_2$, $LiWO_2$, $Li_2WO_4$, $Li_2W_2O_7$, $Li_4WO_5$, $Li_6W_2O_9$, $Li_2TiO_3$, $Li_4Ti_5O_{12}$, $Li_2ZrO_3$, $Li_6Zr_2O_7$, $Li_8ZrO_6$ and $Li_4SiO_4$, etc., and the Z-containing compound can be partially combined with Li.

Preferably, the temperature of the second sintering is 10-400° C. lower than that of the first sintering, and the temperature of the third sintering is 50-600° C. lower than that of the second sintering.

The beneficial effects of the disclosure are as follows:
1. By controlling the temperature and sintering time of the secondary sintering, the prepared gradient single-crystal material can obtain excellent rate performance and significantly reduced material resistance by controlling the Co content on the particles surface at an atomic ratio of Co to (Ni+Co+A) to be greater than 0.4 and less than 0.8. At the same time, the content of Co atoms at the depth of 10% radius from the surface of the single-crystal positive electrode material is made to be not less than 0.3, which can effectively ensure the structural stability of the material during deep discharge and improve the high voltage performance. The gradient single-crystal positive electrode material prepared by the disclosure can achieve the performance of high-Co material or even similar to lithium cobaltate when the usage amount of Co is very low, that is, the material with low cost and high performance can be obtained.
2. During the second sintering at the sintering temperature of 700-900° C., the micropowder containing Co will dissolve into the single-crystal positive electrode material at high temperature, and the amount and depth of Co entering the single-crystal positive electrode material will also increase with the increase of temperature and high temperature holding time. When the temperature is lower than 700° C., the micropowder containing Co will still be in solid morphology, will not dissolve into the single-crystal positive electrode material, and will not form gradient single-crystal positive electrode material. When the temperature is higher than 900° C., all Co enters the single-crystal positive electrode material at too high temperatures, forming a single-crystal positive electrode material with uniform distribution of elements, so that the gradient single-crystal positive electrode material cannot be obtained, and the excellent performance of gradient materials cannot be achieved.
3. The gradient single-crystal material will be pulverized by air flow after primary sintering, during which the agglomerated particles will be forced to open, resulting in sharp edges and corners. Such sharp edges and corners will cause serious abrasion to the equipment during the preparation of the battery electrodes, shorten the service life of the equipment accessories, and greatly increase the manufacturing cost of the battery. In the present disclosure, during the second sintering at the sintering temperature of 700-900° C., the sharp included angle resulting from the particle breakage caused by pulverization will also melt, and the roundness of the particles will be greatly improved as the temperature decreases, in addition, using the positive electrode material provided by the disclosure can reduce the abrasion of the coating equipment and make it easier to process in the process of preparing the positive electrode sheet.
4. In step (1), the material is pulverized to a $D_{50}$ of 2.5-5 microns, which can reduce the resistance of the single-crystal material and improve the electronic conductivity and ionic conductivity. Because the particles are easily broken when $D_{50}$ is less than 2.5 microns, that is, excessive pulverization will produce many fine powder materials. These fine powder materials have large specific surface area and large contact area with the electrolyte, which is easy to cause more side reactions. When $D_{50}$ is greater than 5 microns, it is easy to appear that particles are still agglomerated and the pulverization effect is not realized. At the same time, the pulverization is incomplete, resulting in incomplete contact between materials and conductive agents, which in turn will cause high internal resistance of the battery, moreover, the separation at particle junctions during the charging and discharging cycle will make the material contact worse, resulting in significantly increased resistance, and worsened cycle.
5. By coating the Z compound containing lithium on the gradient single-crystal material, the particle conductivity of the material can be significantly improved, the resistance of the material can be further reduced, and the rate performance of the material can be improved, which can also isolate the direct contact between the material and the electrolyte, reduce the occurrence of side reactions, and extend the cycle life.

DETAILED DESCRIPTION OF THE EMBODIMENTS

The present disclosure will be described in detail below in combination with embodiments.

Explanation of Terms

Term "Roundness" refers to the average value of the radius of curvature of all convex areas of the particle to the radius of the circumcircle of the particle, which can be measured by the dynamic image particle analyzer.

Term "powder resistivity" refers to the resistance of a conductor per unit length and unit cross-sectional area, which is numerically equal to the resistivity, which is measured by charging a certain mass of powder sample (1 to 2 g) into a measuring fixture, putting the fixture into a pre-compaction instrument, starting the pre-compaction instrument to compact for 15 s, then installing the fixture back to the powder resistivity meter, starting the software for the test, and the instrument automatically collects parameters such as pressure, resistance, resistivity, conductivity, sample thickness, and compaction density, etc.

Term "specific discharge capacity" refers to the amount of electricity that can be discharged by the positive electrode active substance per unit mass (in mAh/g).

Term "initial coulombic efficiency" refers to initial discharge capacity/initial charge capacity of a battery.

Term "rater" means that charge-discharge rate=charge-discharge current/rated capacity. Term "battery discharge rate" represents a measure of the discharge speed. The capacity used is discharged completely in 1 hour, which is called 1C discharge; the capacity used is discharged completely in 3 hours, which is called ⅓=0.33C discharge, and similarly, 3C discharge means that the capacity used is discharged completely in 0.33 hours.

Term "10% SOC resistance" refers to a resistance when the remaining capacity of a battery is 10% of the full charge.

Example 1

(1) $NiSO_4$, $CoSO_4$ and $MnSO_4$ were formulated into a mixed salt solution at a molar ratio of Ni:Co:Mn=6:1:3, the concentration of the mixed solution A was 2 mol/L; a NaOH solution with a concentration of 5 mol/L was formulated as the precipitator; an ammonia solution with a concentration of 6 mol/L was formulated as the complexing agent; the mixed salt solution, NaOH solution and ammonia solution were continuously added into a reaction vessel equipped with a stirrer by a metering pump, respectively, the reaction temperature was kept at 40° C., the pH was kept at 11, and the stirring speed was 500 r/min, the whole reaction process was protected by an inert gas. After the reaction was completed, the precipitate obtained was filtered, washed and dried at 110° C. for 4 to 12 hours to obtain $Ni_{0.6}Co_{0.1}Mn_{0.3}(OH)_2$ precursor (NCM613 precursor) with a $D_{50}$ of 3.5 microns.

Figure 3:
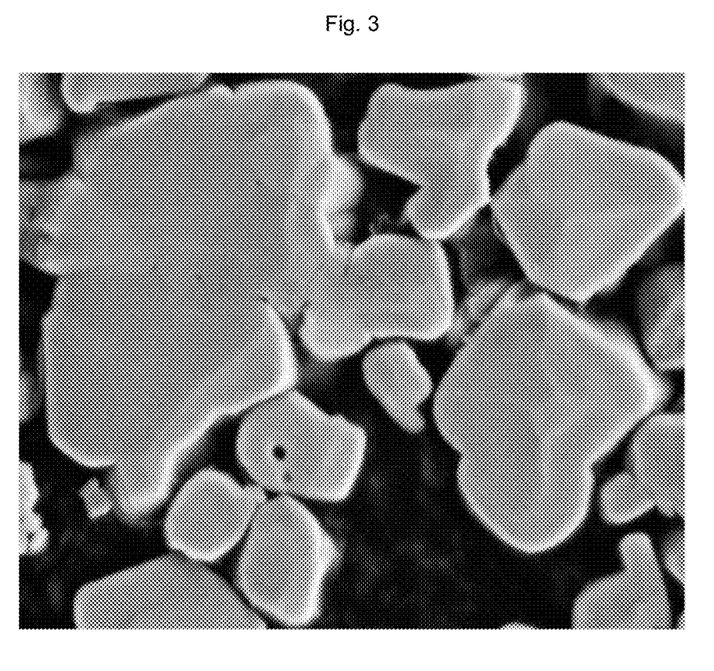
FIG. 3 shows the profile morphology of FIG. 1.

1.07 kg of lithium carbonate and 2.5 kg of NCM613 precursor were weighed according to molar ratio of lithium carbonate to the prepared $Ni_{0.6}Co_{0.1}Mn_{0.3}(OH)_2$ of Li/(Ni+Co+Mn)=1.06, which were mixed for 8 min by an intensive mixer at 3000 rpm, the material was checked until there was no white spots, then the mixing was stopped. The mixed material was charged into a 330*300*100 mm alumina ceramic sagger, and spread, then evenly cut into 36 pieces by a block cutter, which were put into an atmosphere box-type furnace, pure oxygen was injected at 60 L/min, the temperature was raised to the first sintering temperature of 970° C. at a heating rate of 3° C./min and held for 12 hours, then cooled down naturally. The cooled material was broken into crushed material of less than 2 mm by a double twin-roller, and then the crushed material was pulverized and graded by airflow pulverizer to obtain the conventional single-crystal 613 positive electrode material with a $D_{50}$ of 3.8 microns, the morphology of which was shown in FIG. 1 and the profile morphology was shown in FIG. 3.

Figure 2:
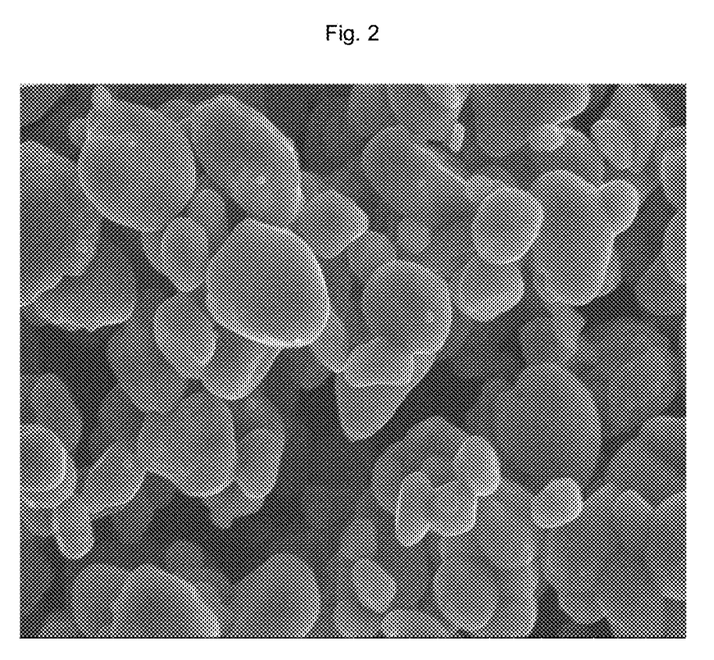
FIG. 2 shows the morphology of gradient single-crystal 613 positive electrode material in example 1.
Figure 4:
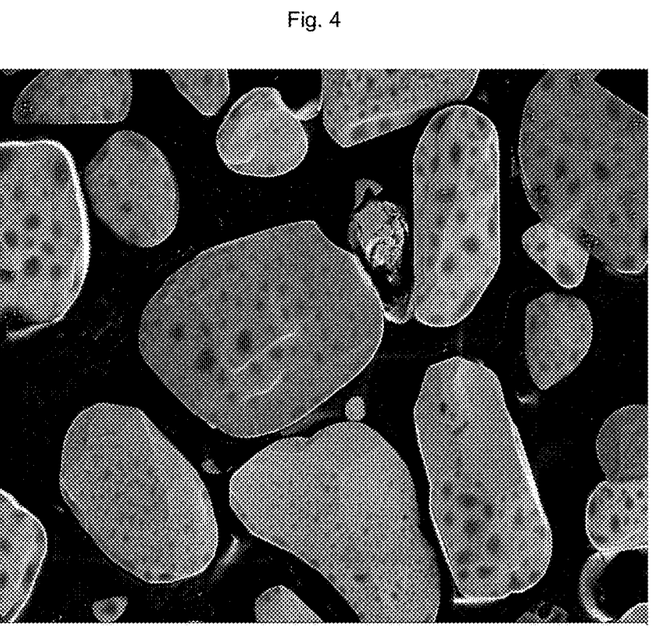
FIG. 4 shows the profile morphology of FIG. 2.

(2) 1.5 kg of the obtained conventional single-crystal 613 positive electrode material and 118 g of nano-$Co(OH)_2$ were mixed evenly in a high-speed mixer, and then held at the second sintering temperature of 850° C. for 5 h, the second sintering temperature was at least 20° C. lower than the first sintering temperature, sieving after naturally cooling to obtain the gradient single-crystal 613 positive electrode material with a $D_{50}$ of 3.85 microns, the morphology of which was shown in FIG. 2 and the profile morphology was shown in FIG. 4.

(3) 1.5 kg of the obtained gradient single-crystal material 613 positive electrode material, 3.8 g of $WO_3$ and 1.4 g of $LiOH \cdot H_2O$ were mixed evenly in a high-speed mixer, the material was charged into a sagger, and held at the third sintering temperature of 400° C. for 5 h, the third sintering temperature was at least 50° C. lower than that of the second sintering temperature. The gradient single-crystal 613 positive electrode material of which the surface was coated with a lithium containing compound and a tungsten containing compound prepared in the disclosure was obtained by sieving.

1. Test for Surface Co and Internal Co Content.

Figure 5:
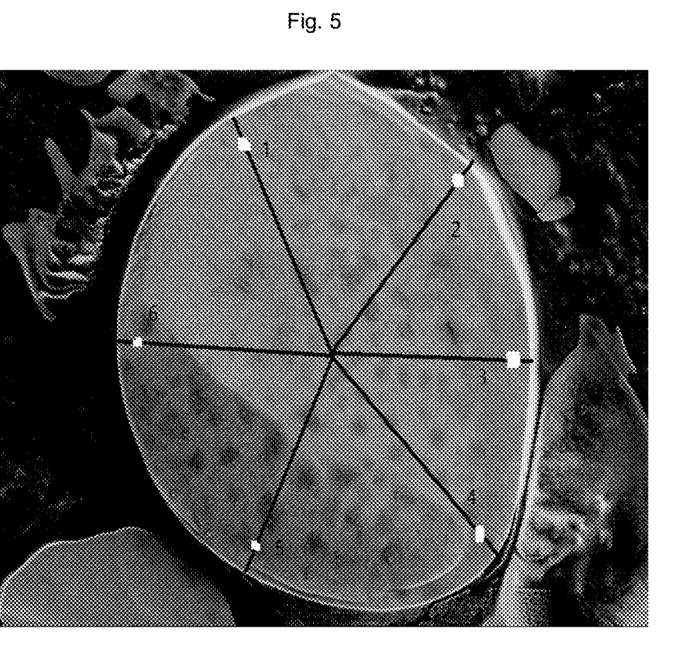
FIG. 5 shows the schematic diagram of 10% radial depth of particles of final product obtained in example 1.

The atomic ratio of Ni, Co and Mn elements was obtained by testing the surface of the positive electrode material finally obtained in the above example 1 using the Energy Dispersive Spectrometer, and the sum of which was 1, and the atomic ratio of Co therein was calculated. Profile processing of the material was carried out by an argon ion profiler to obtain a smooth material section, and then elemental analysis at one tenth of the radius from the material surface was carried out by Energy Dispersive Spectrometer, which was evenly divided into 20 parts in the diameter direction of the material particles, and then elemental analysis at a distance of 1 part from the surface was carried out by Energy Dispersive Spectrometer to obtain the atomic ratio of Ni, Co, and Mn elements, the sum of which was 1, and the atomic ratio of Co therein was calculated. Multiple points on multiple particles can be selected for analysis and then the average value was taken. The schematic diagram of 10% radial depth of particles was shown in FIG. 5. For example, 6 points were tested on one particle, the average proportion of Co of 6 points on the particle was tested, and then 10 particles were tested to calculate the average proportion of Co of the sample.

2. Test of Roundness

The positive electrode material finally obtained in the above Example 1 was dispersed into a certain amount of pure water, fully stirred, and then placed same into an ultrasonic cleaner for ultrasonic dispersion 2-5 minutes. Then, the dispersed sample suspension was added into the sample tester of the dynamic image particle analyzer for testing, and the test result of roundness was automatically calculated and output by the instrument software after the test was completed.

3. Preparation of Button Battery 9.2 g of positive electrode material, 0.3 g of Super-P, 0.2 g of KS-6, and 3 g of 10% PVDF were weighed according to the mass ratio of positive electrode material:Super-P:KS-6:PVDF of 92%: 3%: 2%: 3%, respectively. 4 g of NMP was additionally added and stirred at 3500 rpm for 3 min, then the remaining 2.5 g of NMP was added and stirred at 3500 rpm for 3 min to prepare the positive electrode paste.

The mixed paste was coated evenly on the 35 cm*7.5 cm aluminum foil with a 200-micron coater in the way of manual drag coating, the thickness was ensured to be uniform, the coated electrode sheet was kept horizontal and dried in an air drying oven at 100° C. for 30 min, and the surface density of the electrode sheet was controlled to be 90-110 g/m².

The residual paste on the bright surface of the dried electrode sheet was carefully wiped off with industrial alcohol, and cut into a size of length*width of 25 cm*7.5 cm with the positive electrode board cutter, and then the compaction density was controlled to be 3.2±0.1 g/cm³ by rolling with a twin roller. The rolled electrode sheet was punched into positive electrode sheet with a Φ=14 mm punching die, and at least 6-8 electrode sheets were punched in each batch. The cut positive electrode sheet was gently clamped with insulated tweezers and weighed one by one on a one-hundred-thousandth balance, then the positive electrode sheet was baked in a vacuum oven at 100±3° C. and −0.1 MPa for 8 h. After baking, positive electrode sheet was transferred from the vacuum oven to the glove box within 10 s.

A gasket was put in the anode steel shell, and a lithium sheet was put on the gasket for flattening, 2 drops of electrolyte was injected, then a layer of battery separator was put and 1 drop of electrolyte was injected, and then a positive electrode sheet was installed to make the positive electrode sheet in the center, then clamped same with insulated bamboo tweezers and the positive electrode steel shell was covered. The assembled battery was put into the card slot of the sealing machine according to the requirements that the anode faced upward and the positive electrode faced downward. The sealing was carried out at a sealing machine pressure of 280 kg/cm$^2$ for a pressure holding time of 1 s, then the battery was taken out and wiped clean with dust-free paper, that is, the preparation of the button battery was completed.

4. Test of Electrical Performance

Battery formation. After the prepared button battery was held for about 24 hours, it was constant-current charged at a constant temperature condition of 23° C. and the 0.1C rate current of 3.0-4.4V, then constant-voltage charged at 4.4V and a cutoff current of 0.02C, then 0.1C constant-current discharged to 3.0V, the discharge specific capacity and the initial coulombic efficiency (discharge specific capacity/charge specific capacity) were recorded.

Test of rate. The formed battery was subjected to charge and discharge process steps at 0.33C, 0.5C, 1C, and 3C between 3.0V and 4.4V, respectively, the corresponding discharge capacities of which were recorded, respectively and the ratio of 3C discharge capacity to 0.33C discharge capacity was calculated, this ratio was used to represent the rate performance, and the higher the ratio, the better the rate performance.

Test of resistance. The formed button battery was subjected to constant-current and constant-voltage charging at 1C current with a voltage range of 3.0-4.4V and a cutoff current of 0.02C, then discharged at 1C current $I_1$ for 30 min, let it stand for 1 h, and the current voltage was recorded as $V_0$, and then discharged at 2C current $2*I_1$ for 18 s, and the current voltage was recorded as $V_1$, then discharged at 1C current $I_1$ for 24 min, let it stand for 1 h, and the current voltage was recorded as $V_2$, and then discharged at 2C current $2*I_1$ for 18 s, and the current voltage was recorded as $V_3$, that is, the resistance of 50% SOC was $R_1=(V_0-V_1)/I_1$, and the resistance of 10% SOC was $R_2=(V_2-V_3)/(2*I_1)$.

Test of cycle and cyclic resistance. The constant-current and constant-voltage charging was carried out at 0.5C with a voltage range of 3.0-4.4V and a cutoff current of 0.02C, then discharged at 1C for 18 s and the voltage was recorded, and then continuously discharged at 1C to 3.0V, the above process steps were repeated until the capacity retention rate was less than or equal to 90%, and the cycle was stopped. The cyclic resistance was 4.4V minus the voltage after each 18 seconds of discharge and then divided by 1C current. The electrical performance of the prepared sample was evaluated according to the above preparation method and electrical performance testing method of the button battery. The resistance of this example was set as the reference 100, and the other resistances were the relative values thereto.

Example 2

0.96 kg of nano-sized metal Ni, 0.16 kg of nano-sized metal Co and 0.45 kg of nano-sized metal Mn were mixed in a high-speed mixer at 3000 rpm for 3 min, then 1.07 kg of lithium carbonate was added, and continuously mixed at 3000 rpm for 8 min, the material was checked until there was no white spots, then the mixing was stopped. The mixed material was charged into a 330*300*100 mm alumina ceramic sagger, and spread, then the material was evenly cut into 36 pieces by a block cutter, which were put into an atmosphere box-type furnace, pure oxygen was injected at 60 L/min, the temperature was raised to the first sintering temperature of 970° C. at a heating rate of 3° C./min and held for 12 hours, then cooled down naturally. The cooled material was broken into crushed material of less than 2 mm by a double twin-roller, and then the crushed material was pulverized and graded by airflow pulverizer to obtain the conventional single-crystal 613 positive electrode material with a $D_{50}$ of 3.8 microns. The subsequent preparation method was the same as example 1.

Example 3

This example 3 was the same as example 1, except that "1.5 kg of the obtained conventional single-crystal 613 positive electrode material and 118 g of nano-Co(OH)$_2$" in step (2) of example 1 was changed as "1.5 kg of the obtained conventional single-crystal 613 positive electrode material and 118 g of nano-Co(OH)$_2$ and 2.8 g of nano-Al$_2$O$_3$".

Example 4

This example 4 was the same as example 1, except that "1.5 kg of the obtained conventional single-crystal 613 positive electrode material and 118 g of nano-Co(OH)$_2$" in step (2) of example 1 was changed as "1.5 kg of the obtained conventional single-crystal 613 positive electrode material and 118 g of nano-Co(OH)$_2$ and 6.8 g of nano-ZrO$_2$".

Example 5

This example 5 was the same as example 1, except that "1.5 kg of the obtained gradient single-crystal material 613 positive electrode material, 3.8 g of WO$_3$ and 1.4 g of LiOH·H$_2$O" in step (3) of example 1 was changed as "1.5 kg of the obtained gradient single-crystal material 613 positive electrode material, 3.8 g of WO$_3$, 4.2 g of LiOH·H$_2$O and 2.8 g of nano-Al$_2$O$_3$".

Example 6

"3.8 g of WO$_3$ and 1.4 g of LiOH·H$_2$O" in step (3) of example 1 was changed as "8.5 g of H$_3$BO$_3$, 2.8 g of Al$_2$O$_3$ and 8.1 g of LiOH·H$_2$O".

Example 7

This example 7 was the same as example 1, except that the second sintering temperature in (2) of example 1 was changed as 700° C. and held for 8 h.

Example 8

This example 8 was the same as example 1, except that the second sintering temperature in (2) of example 1 was changed as 900° C. and held for 3 h.

Example 9

This example 9 was the same as example 1, except that "NiSO$_4$, CoSO$_4$ and MnSO$_4$ were formulated into a mixed salt solution at a molar ratio of Ni:Co:Mn=6:1:3" in step (1) of example 1 was changed as "NiSO$_4$, CoSO$_4$ and MnSO$_4$ were formulated into a mixed salt solution at a molar ratio of Ni:Co:Mn=55:5:40".

Example 10

The difference between example 10 and example 1 only lied in that, in step (1), lithium carbonate and NCM613 precursor were weighed according to molar ratio of lithium carbonate to the prepared Ni$_{0.6}$Co$_{0.1}$Mn$_{0.3}$(OH)$_2$ of Li/(Ni+Co+Mn)=0.9; the first sintering was held for 15 hours; pulverized and graded to obtain the conventional single-crystal 613 positive electrode material with a D$_{50}$ of 2.5 microns.

Example 11

The difference between example 11 and example 1 only lied in that, in step (1), lithium carbonate and NCM613 precursor were weighed according to molar ratio of lithium carbonate to the prepared Ni$_{0.6}$Co$_{0.1}$Mn$_{0.3}$(OH)$_2$ of Li/(Ni+Co+Mn)=1.25; the first sintering temperature was changed as 1000° C. and held for 8 hours; pulverized and graded to obtain the conventional single-crystal 613 positive electrode material with a D$_{50}$ of 5 microns.

Example 12

The difference between example 12 and example 1 only lied in that, in step (2), the obtained conventional single-crystal 613 positive electrode material, nano-Co(OH)$_2$ and nano-TIO$_2$ were mixed evenly in a high-speed mixer, where the content of Co was 0.1% by mass of the single-crystal positive electrode material, and the proportion of Ti was 50% by mass of Co; which was sieved to obtain the gradient single-crystal 613 positive electrode material with a D$_{50}$ of 3.8 microns.

Example 13

The difference between example 13 and example 1 only lied in that, in step (1), the sintering temperature was changed as 1000° C., pulverized and graded to obtain the conventional single-crystal 613 positive electrode material with a D$_{50}$ of 5 microns; in step (2), the obtained conventional single-crystal 613 positive electrode material, and nano-Co(OH)$_2$ were mixed evenly in a high-speed mixer, where the content of Co was 10% by mass of the single-crystal positive electrode material, and then held at the second sintering temperature of 930° C. for 5 h, which was sieved to obtain the gradient single-crystal 613 positive electrode material with a D$_{50}$ of 5 microns.

Comparative Example 1

This comparative example 1 was the same as example 1, except that the step (2) of example 1 was omitted.

Comparative Example 2

This comparative example 2 was the same as example 1, except that 118 g of nano-Co(OH)$_2$ in step (2) of example 1 was changed as 20 g of nano-Co(OH)$_2$.

Comparative Example 3

This comparative example 3 was the same as example 1, except that the step (3) of example 1 was omitted.

Comparative Example 4

This comparative example 4 was the same as example 1, except that the LiOH·H$_2$O in step (3) of example 1 was omitted.

Comparative Example 5

This comparative example 5 was the same as example 1, except that the sintering temperature in step (2) of example 1 was changed as 650° C.

Comparative Example 6

This comparative example 6 was the same as example 1, except that the sintering temperature in step (2) of example 1 was changed as 950° C.

Comparative Example 7

This comparative example 7 was the same as example 9, except that the step (2) of example 9 was omitted.

Figure 6:
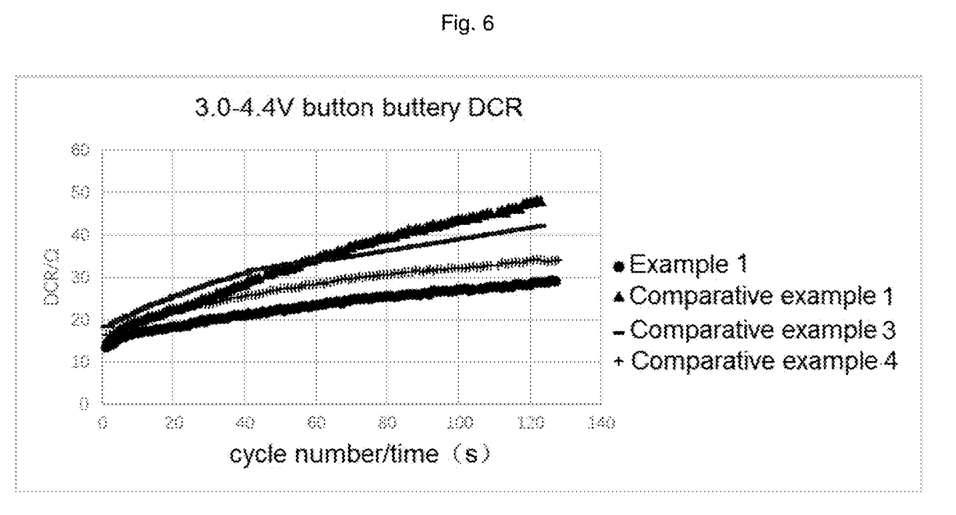
FIG. 6 shows cycle DCR of example 1 and comparative examples 1, 3, and 4.
Figure 7:
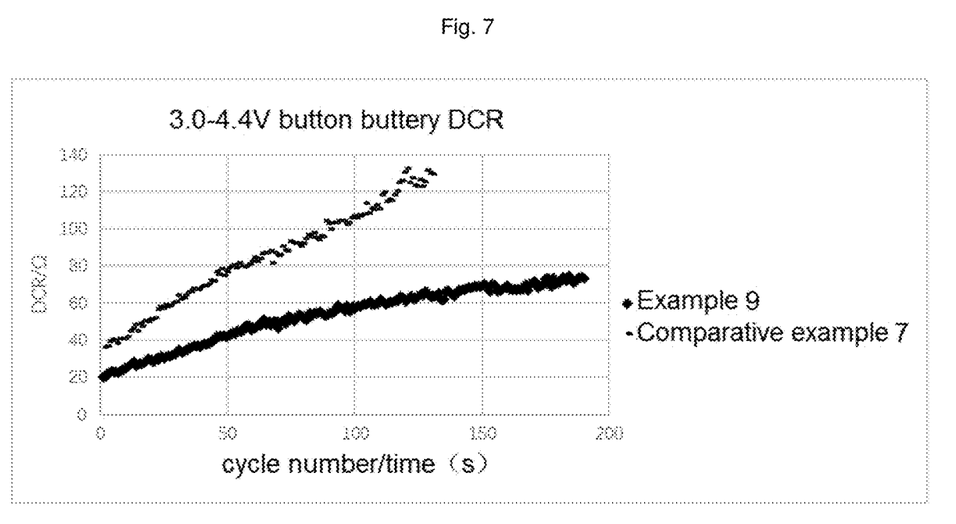
FIG. 7 shows cycle DCR of example 9 and comparative example 7.

The comparisons of capacity, initial coulombic efficiency, rate, resistance, and cycle numbers at 90% retention rate of the positive electrode material ultimately obtained in the above examples and comparative examples are shown in Table 1. The cycle DCRs of example 1 and comparative examples 1, 3, and 4 are shown in FIG. 6, and the cycle DCRs of example 9 and comparative example 7 are shown in FIG. 7.

TABLE 1

|  | Proportion of surface Co atoms | Proportion of Co atoms at 10% depth | Powder resistivity Ω · cm | Roundness | Specific discharge capacity mAh/g | Initial coulombic efficiency % | Rate % | 10% SOC resistance % | Cycle number Number |
|---|---|---|---|---|---|---|---|---|---|
| Example 1 | 0.61 | 0.51 | 130.5 | 0.6 | 192.24 | 90.12 | 90.13 | 100 | 200 |
| Example 2 | 0.6 | 0.5 | 134.7 | 0.6 | 191.52 | 90.05 | 89.37 | 101.55 | 180 |
| Example 3 | 0.62 | 0.49 | 133.4 | 0.6 | 191.68 | 89.95 | 90.21 | 99.52 | 210 |
| Example 4 | 0.61 | 0.5 | 132.3 | 0.6 | 191.78 | 89.94 | 89.75 | 99.06 | 205 |
| Example 5 | 0.59 | 0.51 | 137.8 | 0.6 | 191.41 | 89.82 | 90.32 | 100.15 | 220 |
| Example 6 | 0.6 | 0.51 | 128.9 | 0.6 | 194.32 | 90.9 | 90.41 | 102.04 | 190 |
| Example 7 | 0.75 | 0.33 | 131.3 | 0.5 | 191.93 | 89.96 | 89.94 | 103.32 | 215 |
| Example 8 | 0.48 | 0.39 | 135.6 | 0.7 | 191.52 | 90.02 | 90.21 | 98.56 | 198 |
| Example 10 | 0.61 | 0.51 | 132.3 | 0.6 | 191.12 | 89.93 | 89.95 | 101.22 | 188 |

TABLE 1-continued

| | Proportion of surface Co atoms | Proportion of Co atoms at 10% depth | Powder resistivity Q·cm | Roundness | Specific discharge capacity mAh/g | Initial coulombic efficiency % | Rate % | 10% SOC resistance % | Cycle number Number |
|---|---|---|---|---|---|---|---|---|---|
| Example 11 | 0.61 | 0.51 | 133.5 | 0.65 | 191.84 | 90 | 89.28 | 104.12 | 216 |
| Example 12 | 0.52 | 0.45 | 137.8 | 0.6 | 190.95 | 89.96 | 89.23 | 104.61 | 209 |
| Example 13 | 0.75 | 0.7 | 126.5 | 0.8 | 193.98 | 90.21 | 91.21 | 96.54 | 240 |
| Comparative example 1 | 0.1 | 0.09 | 160.7 | 0.35 | 188.05 | 87.92 | 87.22 | 115.06 | 160 |
| Comparative example 2 | 0.2 | 0.11 | 145.8 | 0.45 | 189.15 | 88.71 | 87.55 | 106.21 | 185 |
| Comparative example 3 | 0.6 | 0.42 | 230.3 | 0.6 | 190.07 | 89.27 | 88.36 | 140.33 | 165 |
| Comparative example 4 | 0.62 | 0.41 | 170.5 | 0.6 | 190.96 | 89.53 | 88.57 | 120.25 | 170 |
| Comparative example 5 | 0.92 | 0.22 | 150.2 | 0.35 | 190.25 | 89.15 | 88.06 | 114.06 | 180 |
| Comparative example 6 | 0.41 | 0.28 | 156.3 | 0.7 | 189.13 | 88.62 | 89.13 | 116.67 | 180 |

The comparisons of capacity, initial coulombic efficiency, rate, resistance, and cycle numbers at 90% retention rate of the positive electrode material ultimately obtained in the above example 9 and comparative example 7 are shown in Table 2.

TABLE 2

| | Proportion of surface Co atoms | Proportion of Co atoms at 10% depth | Powder resistivity Q·cm | Roundness | Specific discharge capacity mAh/g | Initial coulombic efficiency % | Rate % | 10% SOC resistance % | Cycle number Number |
|---|---|---|---|---|---|---|---|---|---|
| Example 9 | 0.51 | 0.32 | 150.6 | 0.5 | 184.08 | 89.7 | 87.33 | 120.34 | 190 |
| Comparative example 7 | 0.05 | 0.05 | 220.7 | 0.4 | 179.14 | 87.53 | 83.37 | 170.08 | 130 |

Comparing example 1 with comparative example 1, it can be seen that the gradient of single-crystal materials can significantly improve the discharge capacity, discharge efficiency, and cycle numbers, while reducing the resistance. At the same time, example 9 and comparative example 7 show that the formation of gradient single-crystal on low-cobalt products makes the performance of the battery more significantly enhanced.

Examples 1, 7, and 8, and comparative examples 1 and 2 show that the surface Co content decreases and the battery performance significantly decreases.

Example 1 and comparative examples 3 and 4 show that coating the surface with a lithium compound is an effective measure to reduce material resistance.

Example 1 and comparative examples 5 and 6 show that the secondary sintering temperature has a significant impact on the gradient distribution of elements, and the gradient distribution of elements also has a significant impact on the electrical performance of materials. When the temperature is low, the content of Co on the surface is high, while when the temperature is high, more Co is melted into the interior of the material. Examples 7 and 8 show that the gradient distribution of Co is within the scope of the requirements of this patent, and the material performance is excellent.

Examples 10 and 11, and comparative example 1 show that the performances of the gradient single-crystal materials prepared in the range of the ratio of Li to the sum of the molar numbers of Ni, Co, and A from 0.9 to 1.25:1 are superior to those of conventional single-crystal materials.

Examples 12 and 13, and comparative example 1 show that the performances of the gradient single-crystal materials prepared by adding elements within the required content range are superior to those of conventional single-crystal materials.

The comparison between example 1 and example 2 shows that the performance of example 2 is poor, which is related to the fact that the mixing effect of nano-metals is not as uniform as the element distribution of precursors prepared by the coprecipitation method.

Figure 1:
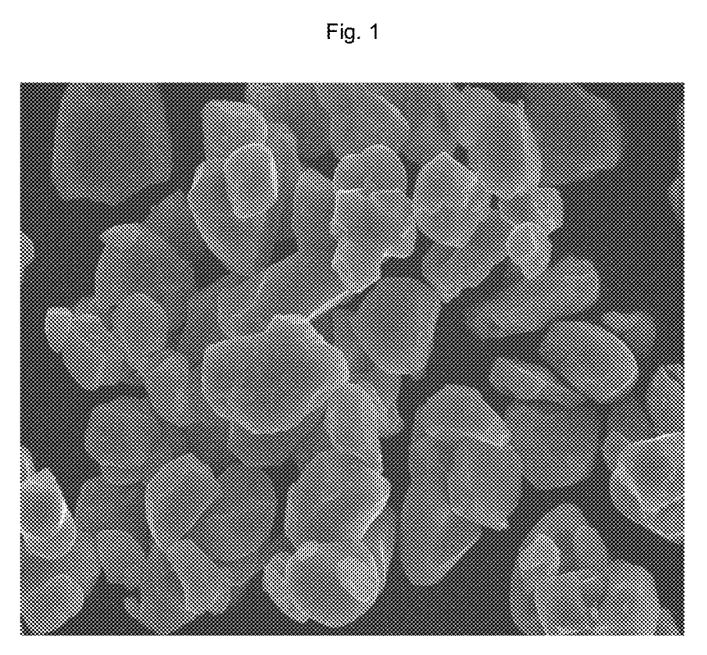
FIG. 1 shows the morphology of conventional single-crystal 613 positive electrode material in example 1.

Comparing FIG. 1 and FIG. 2, it can be seen that during the process of single crystal gradient, the sharp edges and corners of single crystal particles are significantly reduced, the roundness is significantly improved, and the particles become smoother. Such conclusions can also be obtained from the cross-sectional electron micrographs (FIGS. 3 and 4) of the material. In addition, during the gradient process, further fusion occurs at the particle contact sites, making the material more dense.

It can be concluded from both FIGS. 6 and 7 that the increase of DCR during the cycle process can be significantly inhibited by gradient single crystal materials, and the inhibition effect is more obvious on low-cobalt materials. In addition, FIG. 6 shows that coating the surface with a lithium-containing compound also has a significant impact on the change of DCR during the cycle process, especially at the beginning of the cycle, where the DCR is relatively low.

It should be noted that the description of these embodiments is intended to facilitate the understanding of the disclosure, but does not constitute a limitation to the disclosure. In addition, the technical features involved in the various embodiments of the disclosure as described above can be combined with each other as long as they do not constitute a conflict with each other. In addition, the above contents are only partial embodiments of the disclosure, rather than all of the embodiments. Based on the embodiments of the disclosure, all other embodiments obtained by those ordinary skills in the art without creative works fall within the scope of protection of the disclosure.

The invention claimed is:

1. A gradient single-crystal positive electrode material, wherein, the gradient single-crystal positive electrode material has a chemical formula of $LiNi_xCo_yA_{1-x-y}O_2@mLi_aZ_bO_c$, where $0<x<1$, $0<y<1$, $0<x+y<1$, $0<m<0.05$, $0.3<a\le 10$, $1\le b<4$, $1\le c<15$; A is at least one of Mn, Zr, Sr, Ba, W, Ti, Al, Mg, Y, and Nb, and Z is at least one of B, Al, Co, W, Ti, Zr, and Si; on the surface of the gradient single-crystal positive electrode material particles, the atomic ratio of the content of Co to the content of Ni+Co+A is greater than 0.4 and less than 0.8, and at a depth 10% of the radius from the surface of the gradient single-crystal positive electrode material particles, the atomic ratio of Co is not less than 0.3.

2. The gradient single-crystal positive electrode material according to claim 1, wherein, the roundness of the gradient single-crystal positive electrode material particles is greater than 0.4, and there are no sharp edges and corners.

3. The gradient single-crystal positive electrode material according to claim 2, wherein, the initial coulombic efficiency of the gradient single-crystal positive electrode material particles is 89.7% to 91.0%, and the rate of which is 87.33% to 91.0%.

4. The gradient single-crystal positive electrode material according to claim 1, wherein, the initial coulombic efficiency of the gradient single-crystal positive electrode material particles is 89.7% to 91.0%, and the rate of which is 87.33% to 91.0%.

5. A preparation method of a gradient single-crystal positive electrode material according to claim 1, wherein, it comprises the following steps:
   (1) mixing a lithium source with a material comprising Ni, Co, and A according to a ratio of Li to the sum of moles of Ni, Co, and A of 0.9-1.25:1, and subjecting same to the first sintering in an oxygen-enriched atmosphere at a sintering temperature of 800-1000° C. for a sintering time of 8-15 h upon uniformly mixing, then pulverizing the material to D50 of 2.5-5 microns after the material is cooled down, so as to obtain a single-crystal positive electrode material;
   (2) mixing the single-crystal positive electrode material prepared in step (1) with micropowder containing Co, with the content of Co being 0.1% to 10% by mass of the single-crystal positive electrode material, and subjecting same to the second sintering in an oxygen-enriched atmosphere at a sintering temperature of 700-900° C. for a sintering time of 3-8 h upon uniformly mixing, then pulverizing and sieving the material after it is cooled down to obtain a positive electrode material having D50 of 2.5-5 microns;
   (3) mixing the positive electrode material prepared in step (2) with a Li source and a Z-containing compound, then subjecting same to the third sintering in an oxygen-enriched atmosphere at a sintering temperature of 300-750° C. for a sintering time of 3-10 h, and sieving the material after it is cooled down.

6. The preparation method of a gradient single-crystal positive electrode material according to claim 5, wherein, the material containing Ni, Co and A in step (1) is at least one of the precursors of $Ni_xCo_yA_{1-x-y}(OH)_2$, $Ni_xCo_yA_{1-x-y}CO_3$, $Ni_xCo_yA_{1-x-y}C_2O_4$ prepared by coprecipitation method.

7. The preparation method of a gradient single-crystal positive electrode material according to claim 6, wherein, the temperature of the second sintering is 10-400° C. lower than that of the first sintering, and the temperature of the third sintering is 50-600° C. lower than that of the second sintering.

8. The preparation method of a gradient single-crystal positive electrode material according to claim 5, wherein, the material containing Ni, Co and A in step (1) is a mixture of Ni metal element below the micron order, Co metal element below the micron order and A metal element below the micron order at an atomic ratio of x:y:1−x−y.

9. The preparation method of a gradient single-crystal positive electrode material according to claim 8, wherein, the temperature of the second sintering is 10-400° C. lower than that of the first sintering, and the temperature of the third sintering is 50-600° C. lower than that of the second sintering.

10. The preparation method of a gradient single-crystal positive electrode material according to claim 5, wherein, the Co in the micropowder containing Co of step (2) is at least one of $Co(OH)_2$, $CoSO_4$, $Co(NO_3)_2$, $CoCO_3$, $CoCl_2$, CoO, $Co_3O_4$, and Co metal element.

11. The preparation method of a gradient single-crystal positive electrode material according to claim 5, wherein, in addition to Co, the micropowder containing Co of step (2) comprises at least one of Mn, Al, W, Zr and Ti, and the proportion of which is 0-50% by mass of Co.

12. The preparation method of a gradient single-crystal positive electrode material according to claim 5, wherein, the particle size of the Z-containing compound in step (3) is nano-sized, and the primary particles are less than 500 nm.

13. The preparation method of a gradient single-crystal positive electrode material according to claim 5, wherein, in step (3), the molar ratio of Li to Z in the Li source and the Z-containing compound is 0.3-8:1.

14. The preparation method of a gradient single-crystal positive electrode material according to claim 13, wherein, in step (3), the molar ratio of Li to Z in the Li source and the Z-containing compound is 0.3-1.5:1.

15. The preparation method of a gradient single-crystal positive electrode material according to claim 5, wherein, the temperature of the second sintering is 10-400° C. lower than that of the first sintering, and the temperature of the third sintering is 50-600° C. lower than that of the second sintering.

16. A lithium ion battery, wherein, it comprises a gradient single-crystal positive electrode material according to claim 1.

* * * * *